United States Patent [19]
Han et al.

[11] Patent Number: 5,907,181
[45] Date of Patent: May 25, 1999

[54] TAPERED DIELECTRIC MICROELECTRONIC STRUCTURES AND ASSOCIATED METHODS

[75] Inventors: Min-Koo Han; Yearn-Ik Choi; Han-Soo Kim; Seong-Dong Kim, all of Seoul, Rep. of Korea

[73] Assignee: Samsung Electronics Co., Ltd., Rep. of Korea

[21] Appl. No.: 08/659,495

[22] Filed: Jun. 6, 1996

[30] Foreign Application Priority Data

Jun. 9, 1995 [KR] Rep. of Korea .................. 15210/1995

[51] Int. Cl.⁶ ..................................................... H01L 23/58
[52] U.S. Cl. ............................................. 257/630; 438/713
[58] Field of Search ..................................... 257/630, 638, 257/653, 900, 488; 437/225, 228, 235; 438/713

[56] References Cited

U.S. PATENT DOCUMENTS

| | | | |
|---|---|---|---|
| 4,030,952 | 6/1977 | Luce et al. | 257/638 |
| 4,814,041 | 3/1989 | Auda | 438/713 |
| 5,424,571 | 6/1995 | Liou | 257/344 |
| 5,548,149 | 8/1996 | Joyner | 257/347 |
| 5,585,658 | 12/1996 | Muhai et al. | 257/344 |

FOREIGN PATENT DOCUMENTS 1124657  8/1968  United Kingdom .................. 257/638

*Primary Examiner*—Mark V. Prenty
*Attorney, Agent, or Firm*—Myers Bigel Sibley & Sajovec

[57] ABSTRACT

A diode includes a semiconductor substrate of first conductivity type and including a surface having a doped portion of second conductivity type opposite the first conductivity type. In addition, a dielectric layer on the surface of the substrate extends over a first portion of the doped surface portion and leaves a second portion of the doped surface portion exposed. This dielectric layer includes a low-angle tapered portion having a thickness which increases as said tapered portion extends from the exposed doped surface portion of the substrate. In particular, the low-angle tapered portion of the dielectric layer may extend from the exposed portion of a surface at an angle of less than about 10°. Furthermore, the diode may also include a conductive contact on the exposed portion of the substrate and a field plate extending from the conductive contact over a portion of the dielectric layer.

8 Claims, 7 Drawing Sheets

TAPERED DIELECTRIC MICROELECTRONIC STRUCTURES AND ASSOCIATED METHODS

FIELD OF THE INVENTION

This invention relates to the field of electronics, and more particularly to microelectronic structures and methods.

BACKGROUND OF THE INVENTION

A semiconductor diode having a P-N junction is an electronic device which allows current to pass when a forward biased voltage is applied and which blocks current when a reverse biased voltage is applied. The P-N junction includes a P-type semiconductor and an N-type semiconductor which are in contact with each other. When reverse biased, the voltage across the junction can be increased without significantly increasing a leakage current through the diode until the breakdown voltage for the junction is reached. Once the reverse biased voltage exceeds the breakdown voltage, the current through the reverse biased diode suddenly increases. Accordingly, there is a need in the art to increase the breakdown voltage of a reverse biased P-N junction diode.

In a typical planar diffusion method for producing a P-N junction diode, a cylindrical junction is formed by diffusing a dopant through an oxide window. The resulting junction generates a greater electric field than that produced by an ideal planar junction because of curvature at the edge of the junction. As a result, the breakdown voltage of a cylindrical junction diode is significantly lower than that of an ideal planar junction diode.

A conventional junction termination extension ("JTE") is a termination which reduces the concentration of the electric field in a cylindrical junction diode. The JTE structure has a lateral low dose doping region at the edge of the P-N junction. The maximum electric field generated by the junction is reduced because the JTE structure extends a depletion region into the low dose region. The formation of the conventional JTE structure, however, may require an additional masking procedure to extend the low dose region. This additional masking procedure may increase the cost and complexity of the fabrication of the diode.

SUMMARY OF THE INVENTION

It is therefore an object of the present invention to provide an improved diode.

It is another object of the present invention to provide a diode having an increased breakdown voltage.

It is still another object of the present invention to provide improved methods for fabricating diodes.

These and other objects according to the present invention are provided by methods including the step of doping a substrate through a low-angle tapered portion of a dielectric layer. In particular, a dielectric layer is formed on the surface of a substrate of first conductivity type and defines an exposed portion of the substrate wherein the dielectric layer has a low-angle tapered portion having a thickness which increases as the tapered portion extends from the exposed portion of the surface. The exposed portion of the surface is doped with a dopant having a second conductivity type opposite that of the substrate. In addition, a portion of the surface of the substrate is doped through the low-angle tapered portion of the dielectric layer so that a resulting doped portion of the surface of the substrate becomes gradually shallower as the thickness of the tapered portion of the dielectric layer adjacent the surface becomes thicker. Accordingly, the resulting P-N junction has a reduced curvature at its edge thereby reducing the concentration of the electric field. Thus, the breakdown voltage of the resulting diode is increased.

The tapered dielectric layer can be provided by forming a continuous dielectric layer on the surface of the substrate, and forming a second continuous layer on the first continuous dielectric layer wherein the second continuous layer has a higher etching rate than the first continuous dielectric layer using predetermined etchants. A patterned mask layer is then formed on the second continuous layer, and the second continuous layer and the continuous dielectric layer are then etched through the patterned mask layer to form the dielectric layer having the low-angle tapered portion. This method allows the formation of a low-angle tapered portion of the dielectric layer which extends from the exposed portion of the substrate at an angle of less than about 10°.

In addition, a conductive contact can be formed on the exposed portion of the semiconductor substrate, and a field plate can be formed extending from the conductive contact over a portion of the dielectric layer. The field plate can further increase the breakdown voltage of the diode by further reducing the concentration of the electric field when the diode is reverse biased.

Diodes according to the present invention include a semiconductor substrate of first conductivity type and including a surface having a doped portion of second conductivity type opposite the first conductivity type. The dielectric layer on the surface of the substrate extends over a first portion of the doped surface portion of the substrate and leaves a second portion of the doped region exposed. As discussed above, the dielectric layer includes a low-angle tapered portion having a thickness which increases as the tapered portion extends from the exposed doped portion of the substrate. The low-angle tapered portion of the dielectric layer preferably extends from the exposed portion of the substrate at an angle of less than about 10°.

In addition, diodes according to the present invention preferably include a conductive contact on the exposed portion of the semiconductor substrate, and a field plate extending from the conductive contact over a portion of the dielectric layer. The field plate reduces the concentration of the electric field at the junction thereby increasing the breakdown voltage of the diode.

The structures and methods of the present invention provide an increased breakdown voltage for a reverse biased diode by reducing the curvature of the P-N junction at its edges. This reduced curvature reduces the concentration of the electric field thereby increasing the breakdown voltage. In particular, the junction can be formed by doping the substrate through a dielectric layer having a low-angle tapered portion. This doping step can be advantageously implemented using a single masking step. The breakdown voltage can be further increased by providing a field plate over a portion of the dielectric layer. Accordingly, a diode with a relatively high breakdown voltage can be provided according to the present invention.

DETAILED DESCRIPTION

Figure 1A:
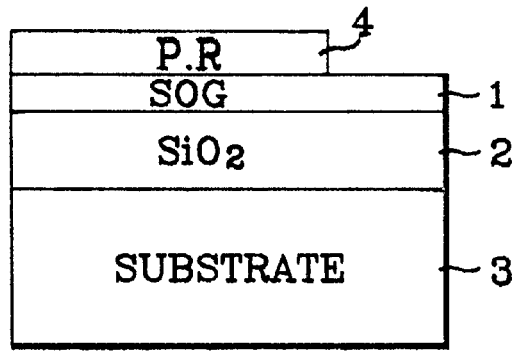
FIGS. 1A–1E are cross-sectional views of a microelectronic structure illustrating steps in a method for forming a diode according to the present invention.

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

FIGS. 1A–1E show sequential steps in a method for producing a diode according to the present invention in which a region having a low dopant concentration is extended under an oxide layer by using a tapered etching step. As shown in FIG. 1A, a dielectric layer 2, such as a silicon dioxide layer, is formed on a substrate 3. In particular, the substrate can be an N-type silicon substrate having a specific resistance of 10–20 ohm-cm. This dielectric layer may have a thickness of between 1 and 2 $\mu$m. This oxide can be formed by placing a semiconductor substrate in a thermal furnace for on the order of ten hours with a wet (H₂O) atmosphere. A second continuous layer 1 is then formed or deposited on the dielectric layer 2 wherein the second continuous layer 1 has a higher etching rate than that of the dielectric layer 2 formed on the substrate 3 using predetermined etchants. The second continuous layer 1 can be formed by evaporating a spin-on-glass ("SOG") having a relatively high etching rate on the dielectric layer 2, and hardening the SOG by spinning for 20–30 seconds at 2,500 rpm. The spin-on-glass can be heat treated at a high temperature after spinning in order to further harden the spin-on-glass. A patterned mask layer 4, such as photoresist, is formed on the second continuous layer 1.

Figure 1B:
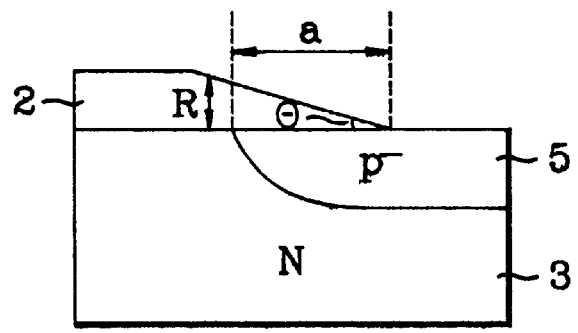
Figure 5:
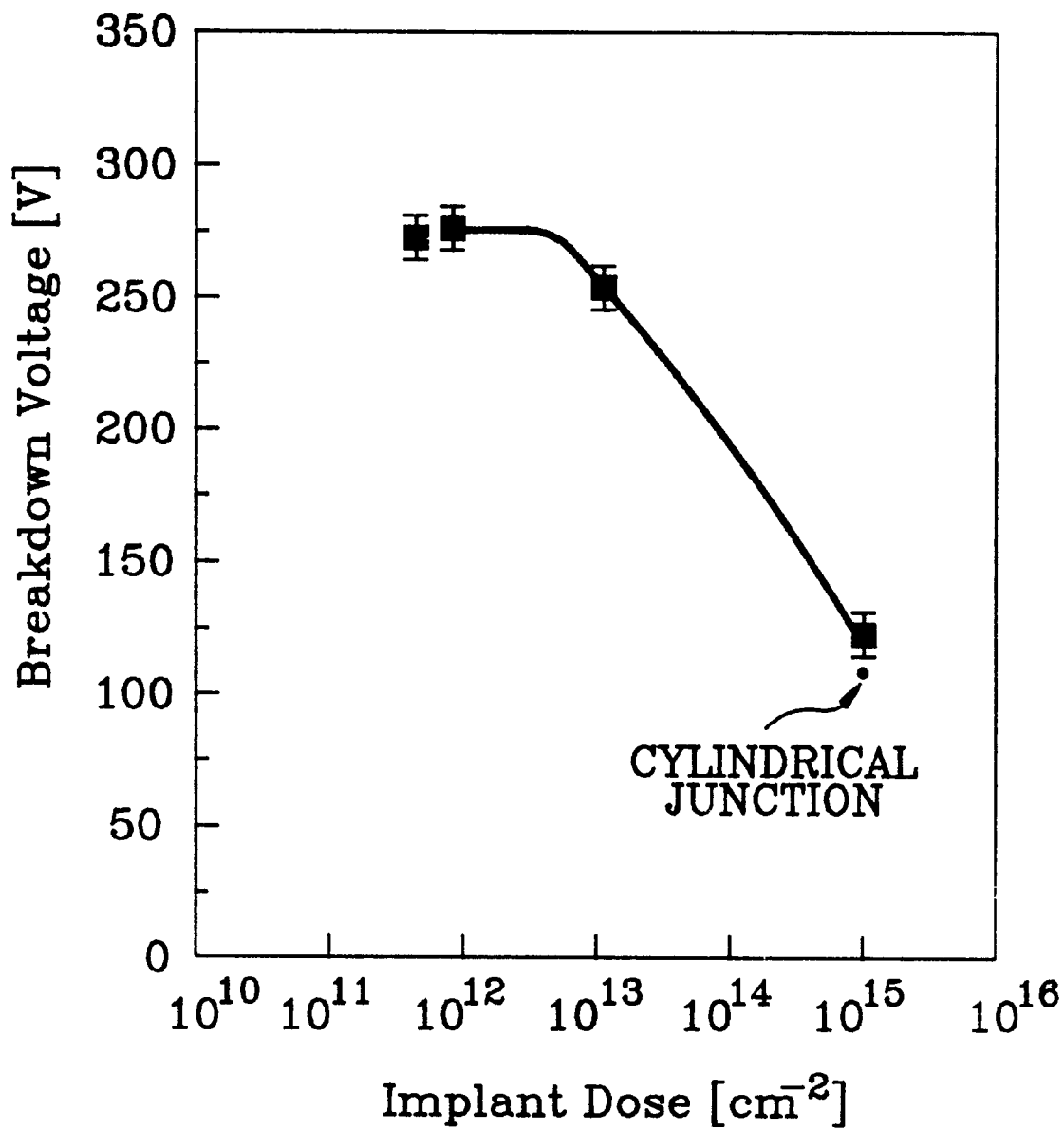
FIG. 5 is a graph illustrating the breakdown voltage of a P+-P−-N diode without a field plate as a function of the implant dose when a 5° tapered SiO₂ layer is employed according to the present invention.

The structure including mask layer 4 is then etched to form the structure shown in FIG. 1B. For example, the masked structure can be dipped in an etchant which etches the second continuous layer 1 at a higher rate than the dielectric layer 2. Accordingly, the dielectric layer 2 of FIG. 1B has a low-angle tapered portion with an angle θ. As further shown in FIG. 1B, the substrate 3 can include an N-type dopant and a surface portion of the substrate can be doped with a P-type dopant such as boron. In particular, the P-type dopant can be implanted into the exposed portion of the substrate 3 to form the P− region 5. As shown, the implanted dopant also penetrates the thinner tapered portion of the dielectric layer 2. Accordingly, the P− region gets gradually thinner as the dielectric layer 2 gets thicker. With angle θ, the P− region extends a distance a under the dielectric layer 2. This structure reduces the concentration of the electric field at the edge of the P-N junction, thereby increasing the breakdown voltage of the diode. The dopant concentration of the P− region 5 can be, for example, 5×10¹¹, 1×10¹² or 1×10¹⁵ cm⁻², and this dopant can be implanted into the substrate 3. In particular, FIG. 5 illustrates the breakdown voltages of devices with various implant doses when the implantation energy is 180 KeV. An optimal breakdown voltage is shown to occur with an implant dose of 1×10¹² cm⁻². In a particular embodiment, the P-type dopant can be implanted with an energy of 180 KeV to produce a dopant concentration on the order of 10¹² to 10¹³ cm⁻² with an average implant depth of 0.5 $\mu$m.

Figure 1C:
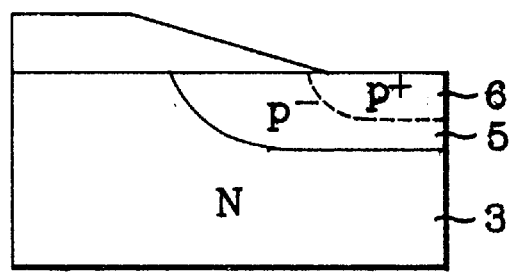

In FIG. 1C, there is shown a P+ region 6 having a relatively high dopant concentration. This P+ region 6 can be formed by a thermal predeposition process on the exposed portion of the substrate. For example, a solid source such as BN1100 can be used in a predeposition process which is performed at a temperature on the order of 1050° C. for 40 minutes. This structure can also be annealed for 40 minutes at a temperature on the order of 1050° C. in a wet atmosphere. As shown, the P− region 5 extends further both vertically and horizontally into the substrate 3 than the P+ region 6.

Figure 1D:
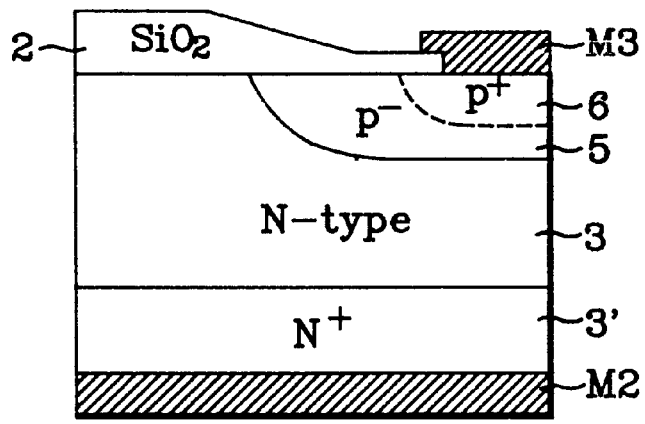

In FIG. 1D, conductive contacts M2 and M3 have been added to the diode structure. These contacts can be metal contacts such as aluminum, for example. In addition, a heavily doped N+ region 3' has been added to provide an ohmic contact for the layer M2. The P+ region 6 provides an ohmic contact for the layer M3.

Figure 1E:
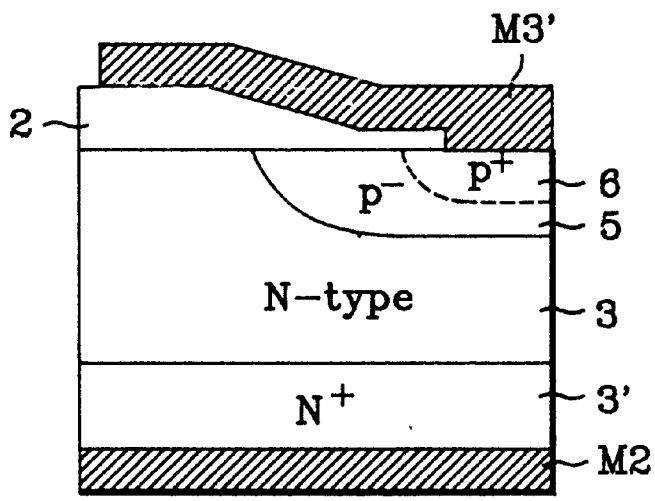
Figure 6:
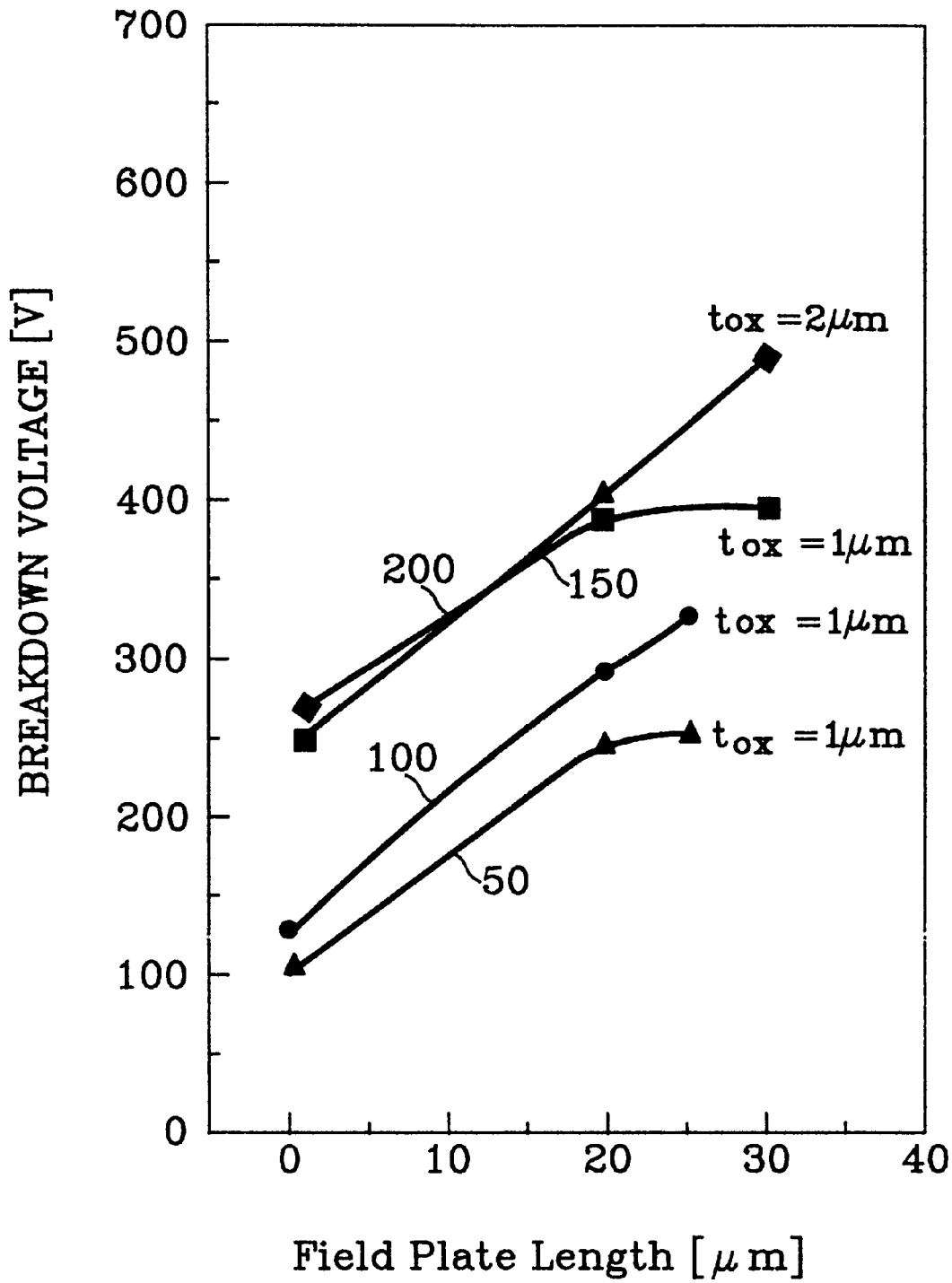
FIG. 6 is a graph illustrating the breakdown voltage of a P+-P−-N diode with a field plate as a function of the field plate length and an oxide thickness for various implant doses with a 5° tapered SiO₂ layer.

In FIG. 1E, the conductive contact M3' has been extended over the dielectric layer 2 to form a field plate. The field plate increases the breakdown voltage of the diode when a reverse biased voltage is applied by further reducing concentration of the electric field at the edge of the P-N junction. In FIG. 6, breakdown voltages are plotted as a function of the field plate length. As shown, the breakdown voltage is plotted for each of four diodes with extended lengths of contact M3' to form field plates with respective lengths of 0, 20, and 30 $\mu$m. The highest plotted breakdown voltage is shown to occur with a field plate length of 30 microns.

Figure 2:
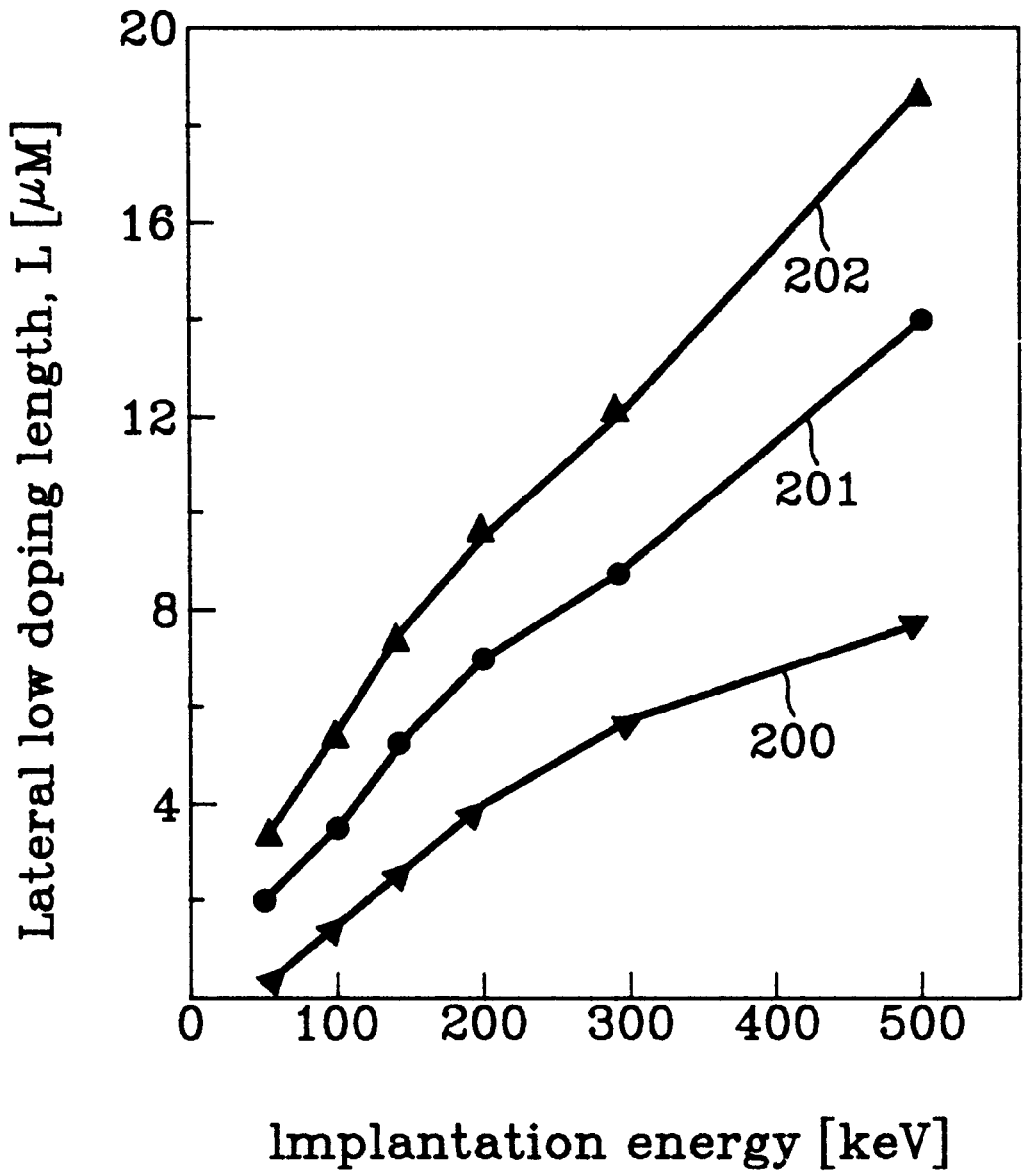
FIG. 2 is a graph illustrating the lateral low doping region extension length as a function of the implantation energy and the angle of the tapered portion of the dielectric layer according to the present invention.
Figure 3A:
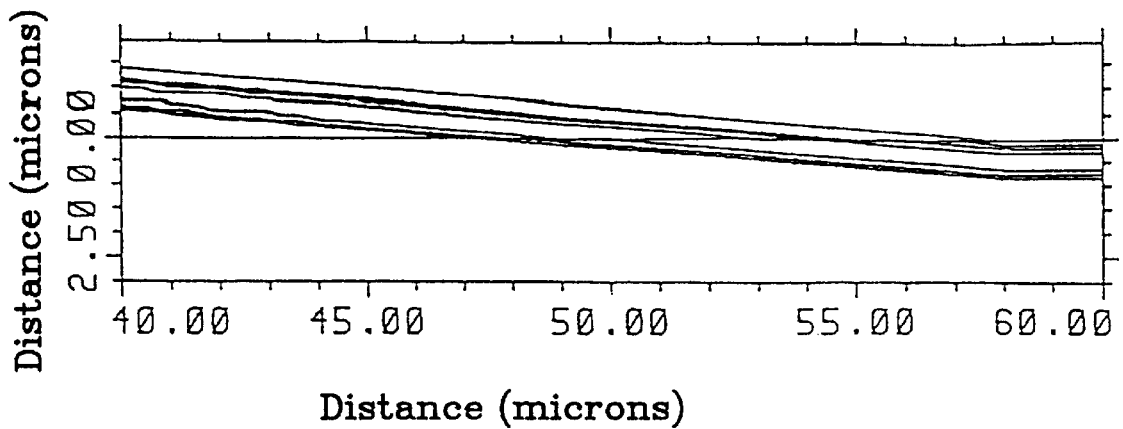
FIGS. 3A–3C are cross-sectional views illustrating simulated two-dimensional boron concentration profiles of microelectronic devices according to the present invention.
Figure 3B:
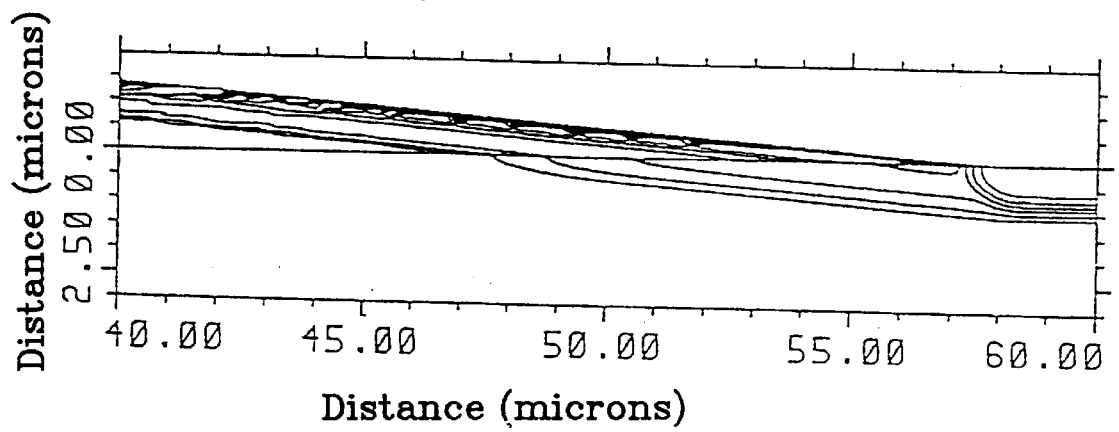
Figure 3C:
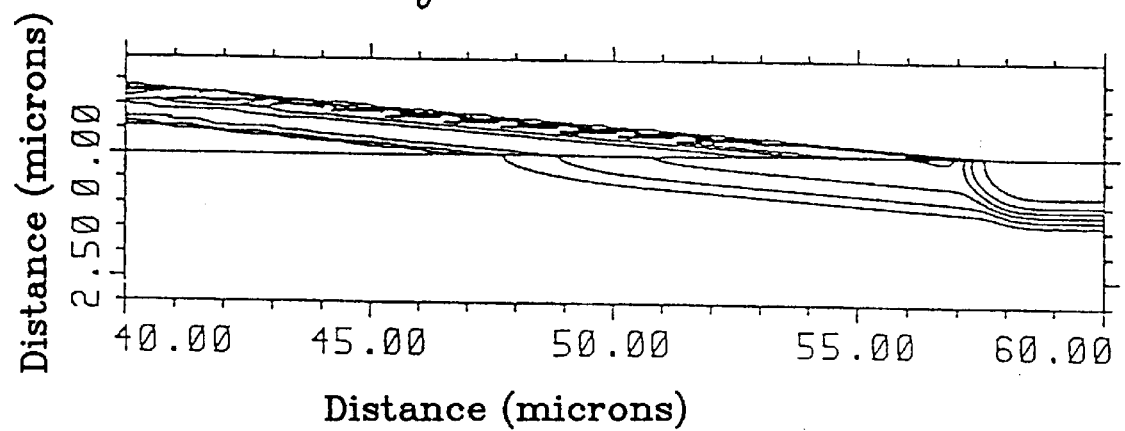

FIG. 2 is a graph illustrating the lateral extension of the P− region 5 beneath the dielectric layer 2 as a function of the implantation energy and the angle θ of the tapered dielectric layer. When the dopant for the P− region is implanted, the thickness of the dielectric through which the dopant can penetrate is a function of the implantation energy. In FIG. 2, data line 202 represents a dielectric oxide layer which is taper-etched to an angle θ of 4.1°. This data line shows that the lateral extension a increases as the implantation energy increases. Data line 201 shows the lateral diffusion length with a dielectric oxide layer which is taper-etched at an angle of 5.7°. Again, the lateral diffusion length of the dopant is increased as the implantation energy is increased. Data line 200 shows the lateral diffusion length when the dielectric oxide is taper-etched an angle of 9°.

Assuming the angle of the taper-etched dielectric oxide is θ, an average depth at which the implanted dopant is distributed at a predetermined implantation energy is Rp, and a dispersion is ΔRp. Accordingly, the thickness of the dielectric oxide layer which blocks the implanted dopant is Rp+ΔRp. The lateral diffusion length into which the impurity can extend beneath the dielectric oxide is thus represented in the following formula:

$$L = (Rp + \Delta Rp) \times \arctan\theta.$$

As set forth in this formula, the taper angle θ of dielectric layer should be relatively small, and Rp+ΔRp should be relatively large in order to increase the lateral extension of the P⁻ region. Again, the values of Rp and ΔRp are a function of the implantation energy.

The diode may also require a P⁺ region 6 with a high dopant concentration so that an ohmic contact is formed with the contact layer M3. In addition, the P⁺ region 6 may reduce a leakage current when a reverse biased voltage is applied to the diode. As shown in FIGS. 1D and 1E, the lateral length of the P⁻ region 5 should be longer than that of the P⁺ region 6 in order to reduce the concentration of the electric field at the P-N junction. By using a P-type dopant with a diffusion coefficient which is small relative to that of the N-type dopant of the substrate, the lateral diffusion length of the P⁺ region 6 formed by solid source diffusion can be made shorter than that of the P⁻ region 5 formed by implantation when a thermal diffusion step is used. FIG. 2 is a graph illustrating a lateral extension length of the P⁻ region 5 as a function of the implantation energy and the angle of the tapered portion of the dielectric layer 2 according to the present invention.

In FIG. 1, the concentration distribution of the P-type dopant at the time of implantation has been modeled by a Pearson distribution model. In the case that the implantation and the diffusion steps are performed through a window of the tapered dielectric layer 2, however, the distribution of the dopant may not be exactly modeled by a Pearson distribution model. Accordingly, a Gaussian distribution model is used to model the dopant concentration distribution.

According to the following example, a P-N junction may be obtained by double diffusing the P-type dopant through the window defined by the dielectric layer 2 including the tapered portion as modeled by simulation. A 2 μm oxide dielectric layer 2 is sufficient to block the implant from the substrate with an implantation energy of up to 500 KeV. The oxide dielectric layer 2 includes a tapered portion having an angle θ of 5°. The P⁻ region 5 is formed by implanting a P-type dopant such as boron into the exposed portion of the substrate 3 and through the tapered portion of the oxide dielectric layer 2. The P⁻ region 5 forms the P-N junction in the form of a Gaussian distribution. The point of maximum dopant concentration is Rp distant from the surface being implanted. Where the substrate 3 is exposed, most of the dopant is implanted into the substrate. Where the tapered portion of the oxide dielectric layer 2 begins rising at the angle θ from the exposed portion of the substrate 3, a decreasing portion of the dopant is implanted into the substrate. As the oxide dielectric layer thickens along the tapered portion, more of the implanted dopant remains in the oxide and less of the implanted dopant makes it to the substrate. Accordingly, at a distance a from the beginning of the tapered portion of the oxide dielectric layer 2, the P⁻ region 5 ends and all of the implanted dopant is blocked by the dielectric layer. In other words, the dielectric layer reaches a critical thickness at a distance a from the edge of the tapered portion which blocks the implanted dopant from the substrate.

Figure 4A:
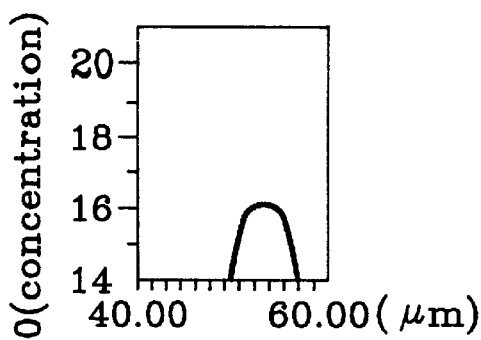
FIGS. 4A–4F are graphs illustrating simulated one-dimensional boron concentration profiles according to the present invention.
Figure 4B:
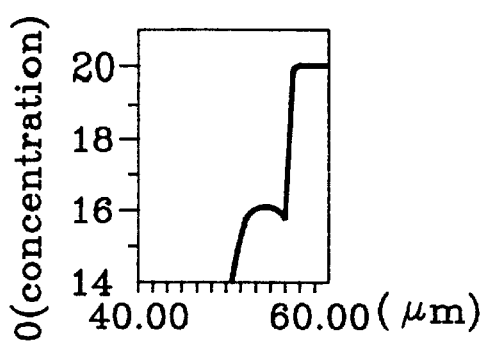
Figure 4C:
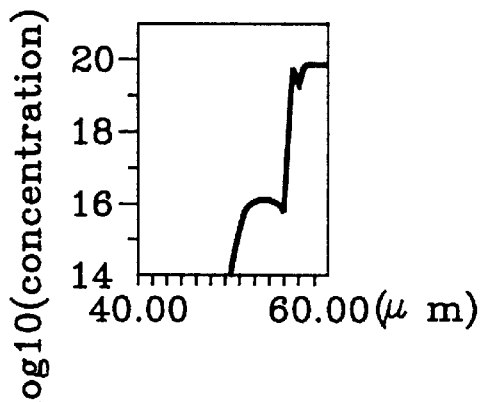

FIGS. 4A–4F graphically illustrate a simulated one-dimensional boron dopant profile according to the present invention. In particular, FIGS. 4A, 4B and 4C illustrate a dopant profile at the interface between the substrate and the dielectric layer. FIG. 4A shows the maximum dopant concentration contour line after implantation. FIG. 4B illustrates the dopant profile after thermally predepositing the P-type dopant at a temperature on the order of 1050° using a solid source. At this time the solubility of a solid source is $2 \times 10^{20}$ cm⁻³. The maximum dopant concentration in the substrate surface is caused by the predeposition of the solid source and is distributed in the form of a monotonically decreasing function with a dopant concentration on the order of $2 \times 10^{20}$ cm⁻³. In the monotonically decreasing function of dopant concentration, the region with the high dopant concentration is piled on the region with the low dopant concentration which was previously implanted. The high dose dopant which is thermally predeposited by the solid source is distributed in the form of a circle at an initial point from which the tapered dielectric layer begins.

Figure 4D:
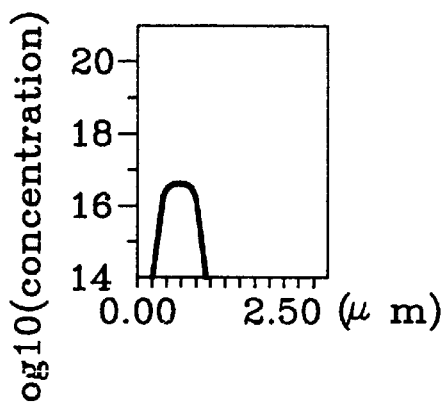
Figure 4E:
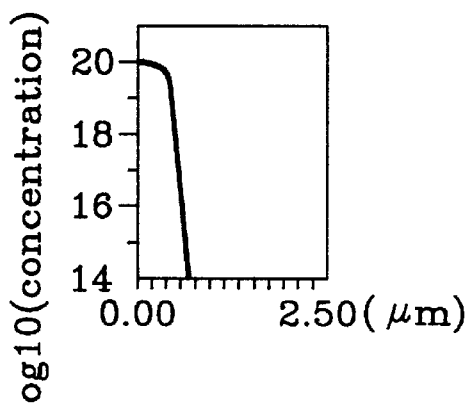
Figure 4F:
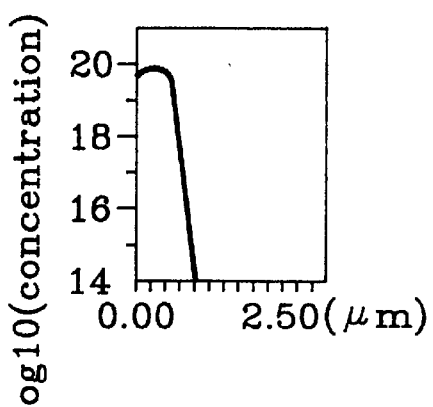

FIG. 4C illustrates the dopant profile after an annealing step which activates the dopant previously permeated into the substrate. The annealing step is performed at a temperature on the order of 1050° to thereby extend a depth of the junction and rearrange the distribution of the dopant. FIGS. 4D, 4E and 4F illustrate the dopant profile along the vertical line passing through the P-N junction.

FIG. 5 is a graph illustrating the breakdown voltage of the diode without a field plate as a function of the implant dose when a dielectric oxide layer is formed with a tapered portion having an angle θ of 5°. The taper angle θ of 5° can be measured by a scanning electron microscope, and the junction depth of the diode can be on the order of 1 μm in the substrate with a dopant concentration on the order of $2 \times 10^{14}$ cm⁻³. The breakdown voltage of a conventional diode having a cylindrical junction with a junction depth on the order of 1 μm in the substrate can be determined theoretically to be 110 V. The breakdown voltage of a diode obtained by implanting a high dose dopant of $10^{15}$ cm⁻² into a tapered oxide dielectric masked layer may be similar to that of a diode with a cylindrical junction. The region implanted with the high dose dopant may not be depleted, and concentration of the electric field may still occur. A breakdown voltage of over 250 V, however, may be obtained by a diode formed using the double diffusion method wherein a low dose dopant is implanted into the substrate. Accordingly, the implantation of the low dose dopant and the use of the tapered dielectric layer can improve the breakdown voltage of a diode by over two times when compared with the breakdown voltage of a diode having a cylindrical junction.

FIG. 6 illustrates the breakdown voltage of a diode including a field plate as a function of the field plate length and the oxide thickness for various doses of implanted dopant wherein the dopant is implanted through a tapered SiO₂ dielectric layer with an angle θ of 5°. As shown, the breakdown voltage generally increases as the oxide thickness increases and as the field plate length increases. The breakdown voltage is saturated when the oxide thickness and the field plate length are at a critical value. A greater thickness of the oxide results in a decrease of the electric field at the end of the field plate, thereby increasing an internal voltage. A long field plate effectively suppresses a curvature effect of the P-N junction, thereby further increasing the breakdown voltage. If a predetermined thickness of the oxide is equal to the thickness of the field plate, however, the breakdown voltage is saturated. This is because the concentration of the electric field in the junction is no longer reduced.

In FIG. 6, various breakdown voltages are illustrated for a diode 50 having a conventional non-tapered oxide dielectric structure, a diode 100 having a tapered oxide dielectric structure, and diodes 150 and 200 having the double diffusion structure on a tapered oxide dielectric layer and provided with a field plate. The diode 50 with the conventional field plate structure has the lowest breakdown voltage, and the diode 100 with the tapered oxide dielectric structure and the diodes 150 and 200 with the double diffusion structures have higher breakdown voltages.

In the diode 50 without the low-angle tapered oxide dielectric layer, the electric field is densely concentrated in the junction, thereby reducing the breakdown voltage. In diodes 100, 150 and 200, however, which include the low-angle tapered oxide dielectric layer, the thickness of the dielectric is relatively thin over the junction and relatively thick at the end of the field plate, thereby reducing the concentration of the electric field where the P-N junction curves. In addition, the diodes 150 and 200 wherein the dopant is first implanted and then diffused into the low-angle tapered oxide dielectric layer, the breakdown voltage is again increased. The diodes 150 and 200 with the double diffusion structures more effectively suppress the concentration of the electric field in the junction when compared with the diodes 50 and 100 not using the double diffusion.

For the diode 150 with the double diffusion structure and low-angle tapered oxide dielectric layer with an oxide thickness of 1 $\mu$m, the breakdown voltage becomes saturated as the length of the field plate is increased from 20 $\mu$m to 30 $\mu$m. In contrast, the diode 200 with the double diffusion structure and the low-angle tapered oxide dielectric layer with a 2 $\mu$m thickness of the oxide has a breakdown voltage which is not saturated but instead increases as the length of the field plate increases from 20 $\mu$m to 30 $\mu$m. This result is obtained by further reducing the concentration of the electric field in the P-N junction. Accordingly, the concentration of the electric field in the junction is most effectively suppressed in the diode 200 having the junction which is double diffused with a low-angle tapered oxide dielectric layer which is 2 $\mu$m thick. This diode thus has the highest breakdown voltage of the diodes illustrated in FIG. 6.

As discussed above, a method for manufacturing a diode according to the present invention has an advantage in that the breakdown voltage of the diode can be increased. In particular, a diode wherein a P$^-$ region is formed by implanting the dopant into the substrate with an energy of 180 KeV and a junction length of 1 $\mu$m, makes it possible to increase the breakdown voltage of the diode to over 130 V beyond the breakdown voltage obtainable in a diode with a conventional cylindrical junction. The use of a field plate together with a tapered dielectric layer and an implanted P$^-$ region can result in a diode with a breakdown voltage over 250 V greater than that obtainable in a diode with a conventional field plate structure. The double junction diode manufactured using the implantation and diffusion onto the low-angle tapered oxide dielectric layer has the advantage that a breakdown voltage of over 150 V can be obtained even in a thin junction condition.

In the drawings and specification, there have been disclosed typical preferred embodiments of the invention and, although specific terms are employed, they are used in the generic and descriptive sense only and not for purposes of limitation, the scope of the invention being set forth in the following claims.

That which is claimed:

1. A method for forming a microelectronic device, said method comprising the steps of:

forming a dielectric layer on a surface of a substrate wherein said dielectric layer defines an exposed portion of said surface and wherein said dielectric layer includes a low-angle tapered portion having a thickness which increases as said tapered portion extends from said exposed portion of said surface, wherein said forming step comprises the steps of, forming a continuous dielectric layer on said surface of said substrate, forming a second continuous layer on said first continuous dielectric layer, wherein said second continuous layer has a higher etch rate than said first continuous dielectric layer, p2 forming a patterned mask layer on said second continuous layer, and etching said continuous dielectric layer and said second continuous layer through said patterned mask layer thereby forming said dielectric layer including said low-angle tapered portion having a thickness which increases as said tapered portion extends from said exposed portion of said surface wherein said low-angle tapered portion of said dielectric layer extends from said exposed portion of said surface at an angle of less than about 10 degrees;

doping said exposed portion of said surface of said substrate; and doping a portion of said surface of said substrate through said low-angle tapered portion of said dielectric layer so that a resulting doped portion of said surface of said substrate becomes gradually shallower as the thickness of said low-angle tapered portion of said dielectric layer adjacent said surface becomes thicker;

wherein said low-angle tapered portion extends from over said resulting doped portion to outside said resulting doped portion.

2. A method for forming a microelectronic device, said method comprising the steps of:

forming a dielectric layer on a surface of a substrate wherein said dielectric layer defines an exposed portion of said surface, wherein said dielectric layer surrounds said exposed portion of said substrate, and wherein said dielectric layer includes a low-angle tapered portion having a thickness which increases as said tapered portion extends from said exposed portion of said surface, wherein said forming step comprises the steps of, forming a continuous dielectric layer on said surface of said substrate, forming a second continuous layer on said first continuous dielectric layer, wherein said second continuous layer has a higher etch rate than said first continuous dielectric layer, forming a patterned mask layer on said second continuous layer, and etching said continuous dielectric layer and said second continuous layer through said patterned mask layer thereby forming said dielectric layer including said low-angle tapered portion having a thickness which increases as said tapered portion extends from said exposed portion of said surface wherein said low-angle tapered portion of said dielectric layer extends from said exposed portion of said surface at an angle of less than about 10 degrees;

doping said exposed portion of said surface of said substrate;

doping a portion of said surface of said substrate through said low-angle tapered portion of said dielectric layer so that a resulting doped portion of said surface of said substrate becomes gradually shallower as the thickness of said low-angle tapered portion of said dielectric layer adjacent said surface becomes thicker;

forming a conductive contact on said exposed portion of said semiconductor substrate; and forming a field plate extending from said conductive contact over said low-angle tapered portion of said dielectric layer surrounding said exposed portion of said substrate.

3. A method according to claim 2 wherein said field plate extends further over said dielectric layer than said doped portion of said surface of said substrate extends under said dielectric layer.

4. A method for forming a diode, said method comprising the steps of:

forming a dielectric layer on a surface of a substrate of first conductivity type wherein said dielectric layer defines an exposed portion of said surface and wherein said dielectric layer includes a low-angle tapered portion having a thickness which increases as said tapered portion extends from said exposed portion of said surface;

doping said exposed portion of said surface of said substrate with a dopant having a second conductivity type opposite said first conductivity type; and doping a portion of said surface of said substrate with said dopant having said second conductivity type through said low-angle tapered portion of said dielectric layer so that a resulting doped portion of said surface of said substrate becomes gradually shallower as the thickness of said low-angle tapered portion of said dielectric layer adjacent said surface becomes thicker;

wherein said forming step comprises the steps of, forming a continuous dielectric layer on said surface of said substrate, forming a second continuous layer on said first continuous dielectric layer, wherein said second continuous layer has a higher etching rate than said first continuous dielectric layer;

forming a patterned mask layer on said second continuous layer, and etching said second continuous layer and said continuous dielectric layer through said patterned mask layer thereby forming said dielectric layer having said low-angle tapered portion having a thickness which increases as said tapered portion extends from said exposed portion of said surface;

forming a conductive contact on said exposed portion of said semiconductor substrate; and forming a field plate extending from said conductive contact over said low-angle tapered portion of said dielectric layer surrounding said exposed portion of said substrate.

5. A method according to claim 4 wherein said field plate extends further over said dielectric layer than said doped portion of said surface of said substrate extends under said dielectric layer.

6. A method for forming a diode, said method comprising the steps of:

forming a dielectric layer on a surface of a substrate of first conductivity type wherein said dielectric layer defines an exposed portion of said surface and wherein said dielectric layer includes a low-angle tapered portion having a thickness which increases as said tapered portion extends from said exposed portion of said surface;

doping said exposed portion of said surface of said substrate with a dopant having a second conductivity type opposite said first conductivity type; and doping a portion of said surface of said substrate with said dopant having said second conductivity type through said low-angle tapered portion of said dielectric layer so that a resulting doped portion of said surface of said substrate becomes gradually shallower as the thickness of said low-angle tapered portion of said dielectric layer adjacent said surface becomes thicker;

wherein said forming step comprises the steps of, forming a continuous dielectric layer on said surface of said substrate, forming a second continuous layer on said first continuous dielectric layer, wherein said second continuous layer has a higher etching rate than said first continuous dielectric layer, forming a patterned mask layer on said second continuous layer, and etching said second continuous layer and said continuous dielectric layer through said patterned mask layer thereby forming said dielectric layer having said low-angle tapered portion having a thickness which increases as said tapered portion extends from said exposed portion of said surface;

wherein said low-angle tapered portion of said dielectric layer extends from said exposed portion of said surface at an angle of less than about 10 degrees; and wherein said low-angle tapered portion extends from over said resulting doped portion to outside said resulting doped portion.

7. A method for forming a microelectronic device, said method comprising the steps of:

forming a dielectric layer on a surface of a substrate wherein said dielectric layer defines an exposed portion of said surface and wherein said dielectric layer includes a low-angle tapered portion having a thickness which increases as said tapered portion extends from said exposed portion of said surface, wherein said forming step comprises the steps of, forming a continuous dielectric layer on said surface of said substrate.

forming a second continuous layer on said first continuous dielectric layer, wherein said second continuous layer has a higher etch rate than said first continuous dielectric layer, forming a patterned mask layer on said second continuous layer, and etching said continuous dielectric layer and said second continuous layer through said patterned mask layer thereby forming said dielectric layer including said low-angle tapered portion having a thickness which increases as said tapered portion extends from said exposed portion of said surface;

wherein said etching step comprises wet etching said dielectric layer and said second layer using a wet etchant; and wherein said low angle tapered portion of said dielectric layer extends from said exposed portion of said surface at an angle of less than about 5 degrees.

8. A method for forming a diode, said method comprising the steps of:

forming a dielectric layer on a surface of a substrate of first conductivity type wherein said dielectric layer defines an exposed portion of said surface and wherein said dielectric layer includes a low-angle tapered portion having a thickness which increases as said tapered portion extends from said exposed portion of said surface;

doping said exposed portion of said surface of said substrate with a dopant having a second conductivity type opposite said first conductivity type; and doping a portion of said surface of said substrate with said dopant having said second conductivity type through said low-angle tapered portion of said dielectric layer so that a resulting doped portion of said surface of said substrate becomes gradually shallower as the thickness of said low-angle tapered portion of said dielectric layer adjacent said surface becomes thicker;

wherein said forming step comprises the steps of:
  forming a continuous dielectric layer on said surface of said substrate;
  forming a second continuous layer on said first continuous dielectric layer, wherein said second continuous layer has a higher etching rate than said first continuous dielectric layer;
  forming a patterned mask layer on said second continuous layer; and
  etching said second continuous layer and said continuous dielectric layer through said patterned mask layer thereby forming said dielectric layer having said low-angle tapered portion having a thickness which increases as said tapered portion extends from said exposed portion of said surface;

wherein said low-angle tapered portion of said dielectric layer extends from said exposed portion of said surface at an angle of less than about 5 degrees.

* * * * *

UNITED STATES PATENT AND TRADEMARK OFFICE
CERTIFICATE OF CORRECTION

PATENT NO. : 5,907,181
DATED : May 25, 1999
INVENTOR(S) : Min-Koo Han, et al.

It is certified that error appears in the above-indentified patent and that said Letters Patent is hereby corrected as shown below:

In the Claims:

In Claim 1, Column 8, Line 2, delete "p2" from the sentence.

Signed and Sealed this

Twelfth Day of October, 1999

Attest:

Q. TODD DICKINSON

Attesting Officer

Acting Commissioner of Patents and Trademarks